United States Patent
Liu et al.

(10) Patent No.: US 8,018,061 B2
(45) Date of Patent: Sep. 13, 2011

(54) INTEGRATED CIRCUIT HARD MASK PROCESSING SYSTEM

(75) Inventors: Wuping Liu, Singapore (SG); Michael Beck, Milpitas, CA (US); John A. Fitzsimmons, Poughkeepsie, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/567,490

(22) Filed: Sep. 25, 2009

(65) Prior Publication Data

US 2010/0013104 A1    Jan. 21, 2010

Related U.S. Application Data

(62) Division of application No. 11/739,595, filed on Apr. 24, 2007, now Pat. No. 7,615,484.

(51) Int. Cl.
*H01L 21/31* (2006.01)

(52) U.S. Cl. . 257/758; 257/760; 257/774; 257/E21.495; 257/E23.01

(58) Field of Classification Search .......... 257/758–760, 257/774; 438/618–624, 637–638, 672–673
See application file for complete search history.

(56) References Cited

U.S. PATENT DOCUMENTS

| | | | |
|---|---|---|---|
| 6,958,526 B2 | 10/2005 | Gates et al. | |
| 6,958,540 B2 | 10/2005 | Gambino et al. | |
| 6,992,003 B2 | 1/2006 | Spencer et al. | |
| 7,049,247 B2 | 5/2006 | Gates et al. | |
| 7,169,701 B2 | 1/2007 | Yeh et al. | |
| 2002/0175414 A1* | 11/2002 | Teh et al. | 257/751 |
| 2004/0175932 A1 | 9/2004 | Kim et al. | |
| 2005/0189612 A1* | 9/2005 | Hung et al. | 257/529 |
| 2005/0233584 A1 | 10/2005 | Jeon et al. | |
| 2006/0270214 A1* | 11/2006 | Iba | 438/637 |
| 2007/0018330 A1* | 1/2007 | Takeda et al. | 257/762 |
| 2007/0264820 A1 | 11/2007 | Liu et al. | |

* cited by examiner

*Primary Examiner* — Dung A. Le
(74) *Attorney, Agent, or Firm* — Mikio Ishimaru

(57) ABSTRACT

An integrated circuit processing system is provided including a substrate having an integrated circuit; an interconnect layer over the integrated circuit; a low-K dielectric layer over the interconnect layer; a hard mask layer over the low-K dielectric layer; a via opening through the hard mask layer and the low-K dielectric layer to the interconnect layer; and an interconnect metal in the via opening.

10 Claims, 4 Drawing Sheets

INTEGRATED CIRCUIT HARD MASK PROCESSING SYSTEM

CROSS-REFERENCE TO RELATED APPLICATION

This application is a divisional of U.S. Non-Provisional application Ser. No. 11/739,595 filed Apr. 24, 2007, and the subject matter thereof is hereby incorporated herein by reference thereto.

TECHNICAL FIELD

The present invention relates generally to a method used in the fabrication of semiconductor integrated circuit devices, and more particularly to the formation of conducting copper lines and interconnects in the copper/low-K technology regime which adopts low-K as inter-level dielectric (ILD).

BACKGROUND ART

In the field of semiconductor fabrication, the use of dielectric materials having a low dielectric constant (k<2.5), known as low-K materials, is well known. Low-K dielectrics are used primarily in backend processing. Backend processing refers generally to processing subsequent to the formation of transistors in the wafer substrate to interconnect the transistors, typically with multiple levels of metal interconnect. Use of hard mask plays an important role in certain low-k integration schemes. The hard mask serves as a sacrificial layer atop of the low-k which avoid direct contact between low-k and photoresist to prevent resist poisoning, ensure low-k film withstands harsh resist rework conditions, and facilitate copper (Cu) chemical-mechanical polishing (CMP) for uniform processing control. Each interconnect level is separated by an inter-level dielectric (ILD). The individual interconnects within a single interconnect level are also separated by a dielectric material that may or may not be the same as the ILD. Vias or contacts are formed in the ILD and filled with conductive material to connect the interconnect levels in a specified pattern to achieve a desired functionality.

Various low-K materials have been used in low-K backend processing with mixed results. Integration of low-K material into existing fabrication processes is particularly challenging in the case of backend processing that includes the use of CMP. CMP is a technique by which each interconnect level is formed in many existing processes. In a CMP process, as implied by its name, a film or layer is physically polished with a rotating polishing pad in the presence of a "slurry" that contains mechanical abrasion components and/or chemical components to produce a smooth upper surface and to remove excess conductive material and thereby isolate the individual interconnects from one another.

One of the key patterning issues related to hard mask integration schemes is its overhang (or low-k undercut) after pattern transfer. The hard mask overhang is defined as the protruding part of hard mask at the trench top opening above the low-k dielectric. Formation of hard mask overhang is primarily related to post-trench-etch resist ash. During that step, the low-k surface at trench sidewall is modified, and an oxide-like layer is formed. Compared to hard mask or low-k film, this oxide-like layer is less resistant to the following wet etch cleaning step (usually a mild aqueous solution containing weak acidic buffer solutions). After wet etch cleaning, an overhang in the trench profile is formed by the removal of the oxide-like layer. A slower hard mask etch rate as compared to low-k film, also accounts for hard mask overhang. The overhang profile may degrade coverage of the copper liner process, and may leave copper voids under the overhang area. Exposed voids after copper CMP, form localized slit defects, may cause both yield loss and reliability degradation.

Thus, a need still remains for an integrated circuit hard mask processing system that integrates a low-K dielectric with a hard mask process that doesn't produce the slit defects, which may adversely impact yield and reliability. In view of the demand for smaller integrated circuit geometries and the increasing operational frequencies of the end devices, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit hard mask processing system including providing a substrate having an integrated circuit; forming an interconnect layer over the integrated circuit; applying a low-K dielectric layer over the interconnect layer; applying a hard mask layer over the low-K dielectric layer; forming a via opening through the hard mask layer and the low-K dielectric layer to the interconnect layer; applying a first fluid and a second fluid in the via opening for removing an overhang of the hard mask layer; depositing an interconnect metal in the via opening; and chemical-mechanical polishing the interconnect metal and the low-K dielectric layer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
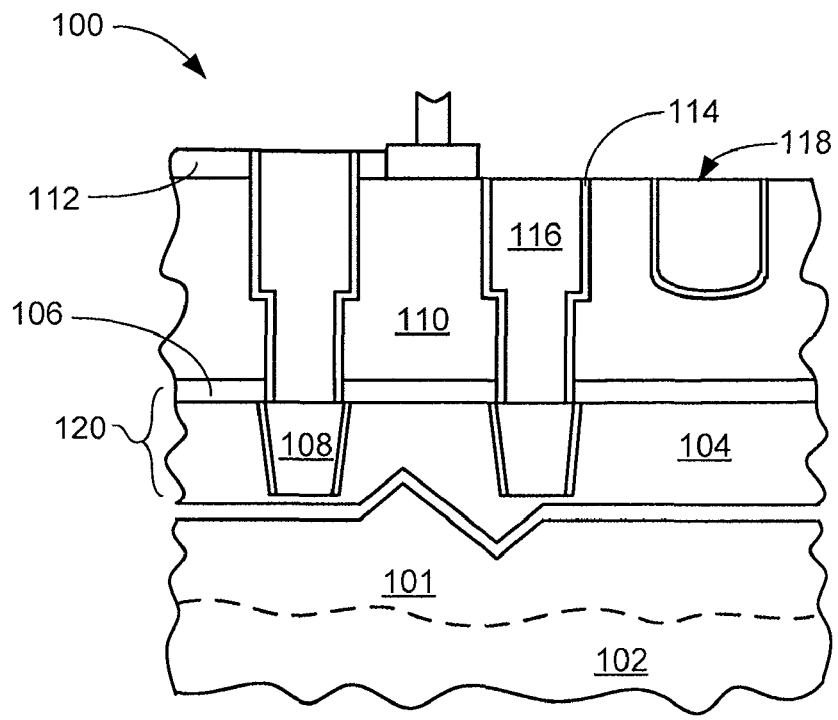
FIG. 1 is a partial cross-sectional view of an integrated circuit hard mask processing system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the conventional plane or surface of the wafer substrate regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Referring now to FIG. 1, therein is shown a partial cross-sectional view of an integrated circuit hard mask processing system 100, in an embodiment of the present invention. The partial view depicts a substrate 102, having an integrated circuit 101 fabricated thereon, an inter-level dielectric layer 104 is deposited over the integrated circuit 101 and is covered by a cap layer 106, such as silicon nitride (SiN), carbon-doped silicon nitride, or nitrogen-doped silicon carbide (nBlok). An interconnect 108, such as a copper interconnect, is electrically connected to the integrated circuit 101 through a contact layer (not shown).

A low-K dielectric layer 110 is deposited over the inter-level dielectric layer 104 and the cap layer 106. The inter-level dielectric layer 104 and the low-K dielectric layer 110 are substantially similar in the chemical make-up and dielectric value (K). A hard mask layer 112, such as silicon oxide ($SiO_x$) or a high K dielectric layer having a dielectric (K) value of greater than 3.7, or the mechanically and/or chemically harder type of the low-K dielectric layer 110, is deposited over the low-K dielectric layer 110.

The dielectric layers may have dielectric constants from 4.2 to 3.9 and are of materials such as silicon oxide ($SiO_x$), tetraethylorthosilicate (TEOS), borophosphosilicate (BPSG) glass, etc. The low-K dielectric layers may have lower dielectric constants from 3.9 to 2.5 and are of materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra-low dielectric layers may have ultra-low dielectric constants below 2.5 and are of such materials as polytetrafluoroethylene (PTFE) commercially available as Teflon-AF and Teflon microemulsion, polyimide nanofoams such as polypropylene oxide, silica aerogels, silica xerogels, and mesoporous silica. The above-mentioned low-K materials may also be used as the hard mask layer 112 as long as they present properties of relatively harder and show lower polishing rate than the low-K dielectric layer 110 as showed in FIG. 1.

A diffusion barrier layer 114, such as a seed metal layer is deposited over the low-K dielectric layer 110 and the hard mask layer 112, and inside the patterned via and trench. The diffusion barrier layer 114 may include an initial 200 Å layer of titanium (Ti), tantulum (Ta) or tantolum nitride (TaN) covered by a 1000-2000 Å layer of copper (Cu). Within the diffusion barrier layer 114, an adhesion promoter, such as Ti, Ta or TaN is used as a diffusion barrier for the copper. An interconnect metal 116, such as copper, is deposited on the diffusion barrier layer 114. A structure surface 118 is formed by a chemical-mechanical polish establishing a coplanar surface between the interconnect metal 116 and the low-K dielectric layer 110. An interconnect layer 120 is comprised of the inter-level dielectric layer 104 and the cap layer 106.

In the present invention, the presence of residual thickness of the hard mask layer 112, or the mechanically and/or chemically softer type of the low-K dielectric layer 110, or the mechanically and/or chemically softer type of the inter-level dielectric layer 104, does not degrade the high frequency operation of the integrated circuit 101. During the CMP, the thickness of the hard mask layer 112 is reduced. Alternatively, the hard mask layer 112 is removed. The residual amount of the hard mask layer 112 present on the low-K dielectric layer 110 acts as a protection from the photoresist (not shown) used to pattern the next level of interconnect.

Figure 2:
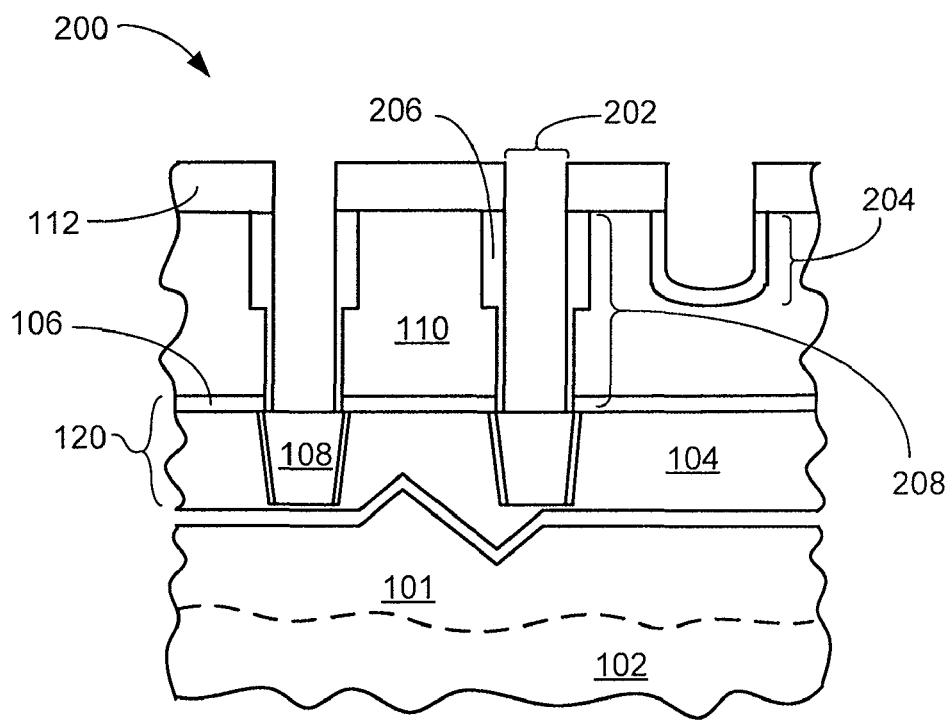
FIG. 2 is a partial cross-sectional view of the integrated circuit hard mask processing system, in a trench etch and resist ash phase of manufacturing.

Referring now to FIG. 2, therein is shown a partial cross-sectional view of an integrated circuit hard mask processing system 200, in a trench etch and resist ash phase of manufacturing. The partial cross-sectional view depicts the substrate 102, having the integrated circuit 101 fabricated thereon, the inter-level dielectric layer 104 is deposited over the integrated circuit 101 and is covered by the cap layer 106, such as silicon nitride (SiN), carbon-doped silicon nitride, or nitrogen-doped silicon carbide (nBlok). The interconnect 108, such as a copper interconnect, is electrically connected to the integrated circuit 101 through a contact layer (not shown).

The low-K dielectric layer 110 is deposited over the inter-level dielectric layer 104 and the cap layer 106. The inter-level dielectric layer 104 and the low-K dielectric layer 110 are substantially similar in the chemical make-up and dielectric value (K). The hard mask layer 112, such as silicon oxide ($SiO_x$) or the high K dielectric layer having a dielectric (K) value of greater than 3.7, or the mechanically and/or chemically harder type of the low-K dielectric layer 110, is deposited over the low-K dielectric layer 110. The hard mask layer 112 isolates the low-K dielectric layer 110 from the photoresist.

A via opening 202 and a trench 204 are formed by etch process. A resist ash process is used to remove the photoresist that patterned the openings for the etch process. During the etch and ash processes, a damage layer 206, such as an oxide like layer, forms into the exposed surface of the low-K dielectric layer 110. A via body 208 is formed by having the via opening 202 in the hard mask layer 112, the low-K dielectric layer 110, and the cap layer 106. The damage layer 206 is less resistant to the wet etch cleaning process than either the hard mask layer 112 or the low-K dielectric layer 110.

Figure 3:
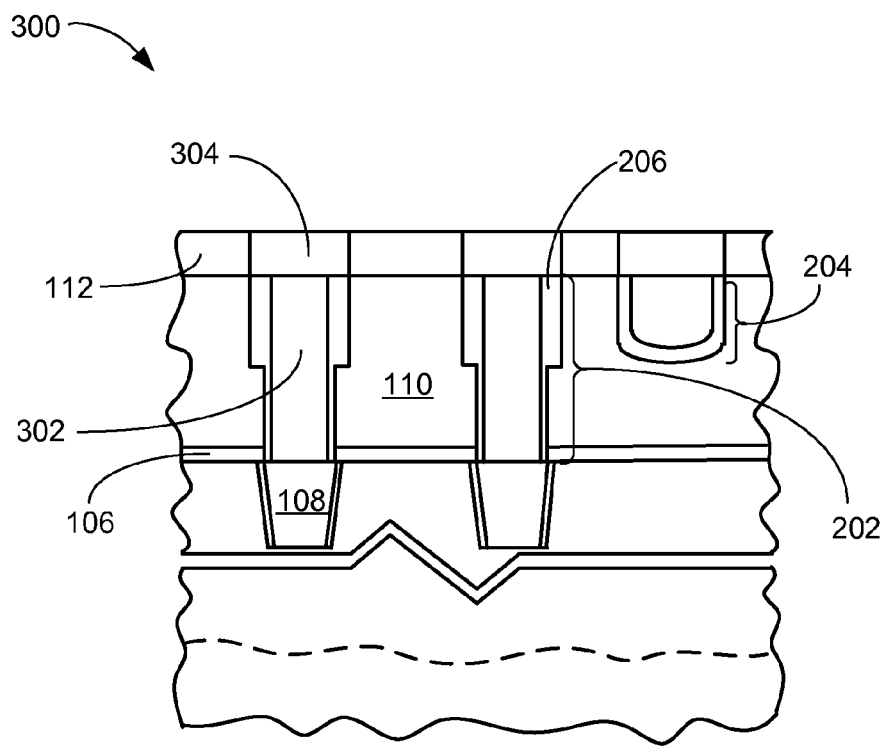
FIG. 3 is a partial cross-sectional view of the integrated circuit hard mask processing system, in a multi-fluid localized etch phase of manufacturing.

Referring now to FIG. 3, therein is shown a partial cross-sectional view of an integrated circuit hard mask processing system 300, in a multi-fluid localized etch process phase of manufacturing. The partial cross-sectional view depicts the via opening 202 and a trench 204, having the damage layer 206, subjected to a localized etching process. A first fluid 302 is applied by a spin tool (not shown) or wet bench (not shown). The first fluid 302 may be de-ionized water, a buffer solution, a solvent, or a gel that will not adversely affect the interconnect 108. A second fluid 304, such as a more aggressive etching agent, is applied by the same tool as the first fluid 302. The second fluid 304 is held in suspension on the first fluid 302. This limits the amount of etching that takes place in the lower section of the via opening 202, preventing an undercut of the cap layer 106.

The second fluid 304 more aggressively etches the hard mask layer 112 at the top of the via opening 202 and across the global bulk of the hard mask layer 112, reducing its thickness. The second fluid 304 etches the hard mask layer 112 beyond the via opening 202, such that the diameter of the opening in the hard mask layer 112 is greater than the diameter of the via opening 202 in the low-K dielectric layer 110. The first fluid 302 reduces the diffusion of the second fluid 304. This protects the interconnect 108 at the bottom of the via opening 202 as well as maintaining the integrity of the cap layer 106. Both of these are required for production yield and reliability of the integrated circuit 101.

Figure 4:
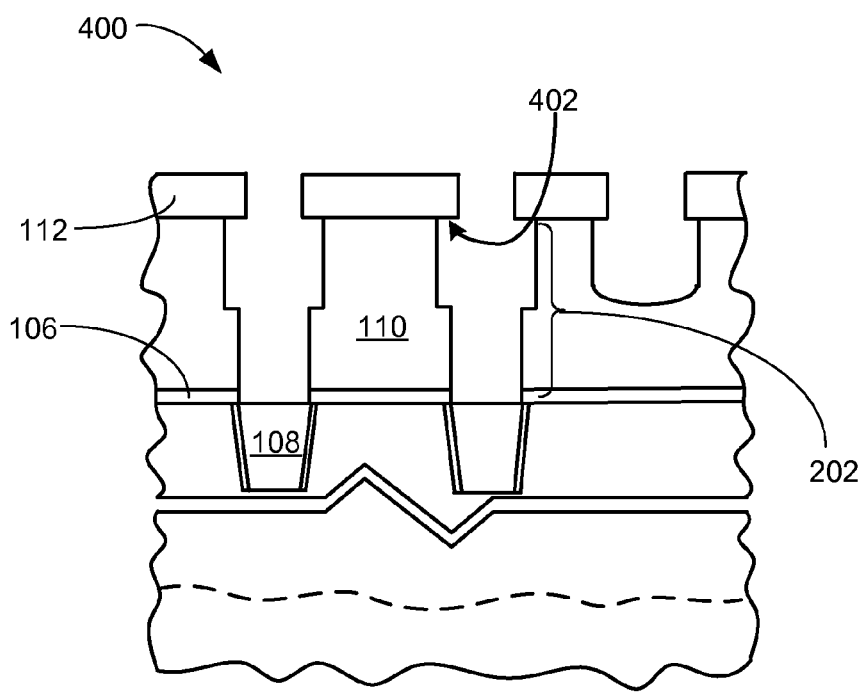
FIG. 4 is a partial cross-sectional view of the integrated circuit hard mask processing system, in a wet etch cleaning phase of manufacturing.

Referring now to FIG. 4, therein is shown a partial cross-sectional view of an integrated circuit hard mask processing system 400, in a wet etch cleaning phase of manufacturing. The partial cross-sectional view depicts an alternative method of manufacturing. In this approach a wet etch cleaning step is used to remove the damage layer 206, of FIG. 2, prior to the localized etching process. A mild aqueous solution of a weak acidic buffer, diluted hydrofluoric acid, or hydrofluoric acid is used to remove the damage layer 206. An overhang 402 of the hard mask layer 112 into the opening of the via opening 202 exemplifies the root manufacturing issue in dealing with the low-K dielectric layer 110. This condition may now be addressed by using the multi-fluid, localized etch process.

Figure 5:
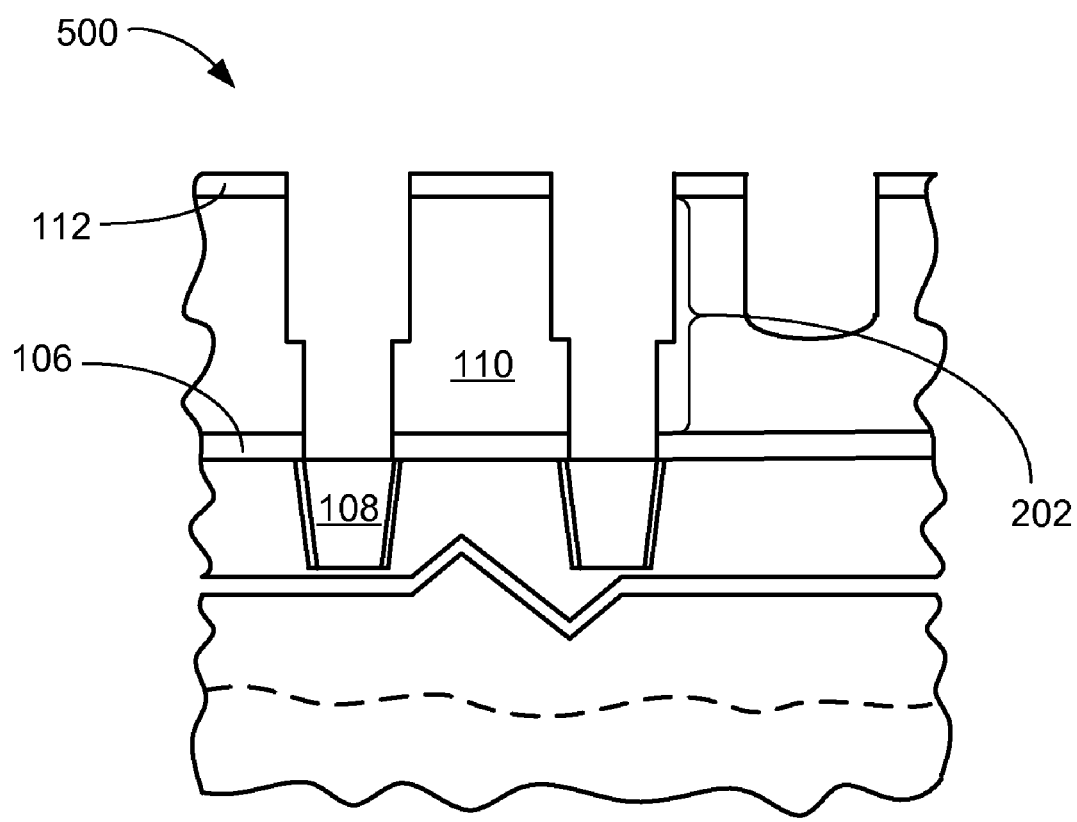
FIG. 5 is a partial cross-sectional view of the integrated circuit hard mask processing system, in an alternative multi-fluid localized etch phase of manufacturing.

Referring now to FIG. 5, therein is shown a partial cross-sectional view of an integrated circuit hard mask processing system 500, in an alternative multi-fluid, localized etch process phase of manufacturing. The partial cross-sectional view depicts the via opening 202 having the hard mask layer 112 etched back to the sidewall of the low-K dielectric layer 110. The multi-fluid localized etch process assures that there is no undercut of the cap layer 106 or damage to the interconnect 108.

Figure 6:
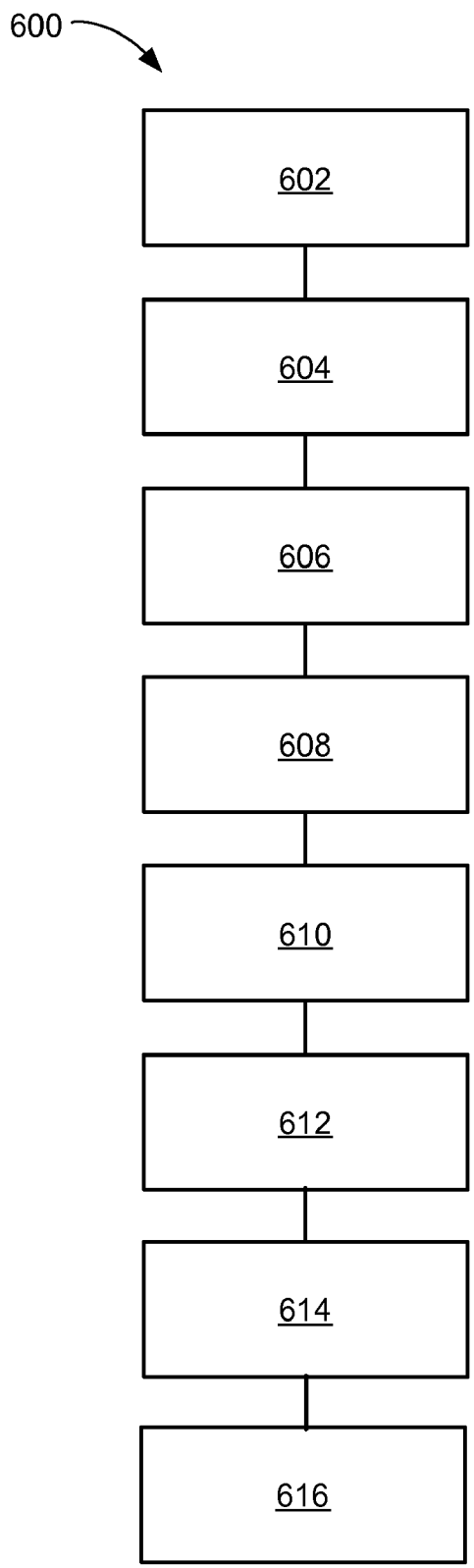
FIG. 6 is a flow chart of an integrated circuit hard mask processing system, for manufacturing the integrated circuit hard mask processing system, in an embodiment of the present invention.

Referring now to FIG. 6, therein is shown a flow chart of an integrated circuit hard mask processing system 600 for manufacturing the integrated circuit hard mask processing system 100 in an embodiment of the present invention. The system 600 includes providing a substrate having an integrated circuit in a block 602; forming an interconnect layer over the integrated circuit in a block 604; applying a low-K dielectric layer over the interconnect layer in a block 606; applying a hard mask layer over the low-K dielectric layer in a block 608; forming a via opening through the hard mask layer and the low-K dielectric layer to the interconnect layer in a block 610; applying a first fluid and a second fluid in the via opening for removing an overhang of the hard mask layer in a block 612; depositing an interconnect metal in the via opening in a block 614; and chemical-mechanical polishing the interconnect metal and the ultra low-K dielectric layer in a block 616.

In greater detail, a system to manufacture an integrated circuit hard mask processing system, according to an embodiment of the present invention, is performed as follows:

1. Providing a substrate having an integrated circuit. (FIG. 1)
2. Forming an interconnect layer over the integrated circuit including providing an interconnect within the interconnect layer. (FIG. 1)
3. Applying a low-K dielectric layer over the interconnect layer. (FIG. 1)
4. Applying a hard mask layer over the low-K dielectric layer includes protecting the low-K dielectric layer from the photoresist. (FIG. 1)
5. Forming a via opening through the hard mask layer and the low-K dielectric layer to the interconnect layer includes forming an opening in a cap layer. (FIG. 1)
6. Applying a first fluid and a second fluid in the via opening for removing an overhang of the hard mask layer includes protecting the cap layer from the second fluid. (FIG. 3)
7. Depositing interconnect metal in the via opening to form a connection to the interconnect within the interconnect layer. (FIG. 1) and
8. Chemical-mechanical polishing the interconnect metal and the low-K dielectric layer. (FIG. 1)

It has been discovered that the present invention thus has numerous aspects.

A principle aspect that has been unexpectedly discovered is that the present invention provides a cost effective solution for the management of the overhang of the hard mask layer created during the etch and ash processes of manufacture.

Another aspect is that the first fluid protects the cap layer at the bottom of the via opening while supporting the second fluid which globally reduces the thickness of the hard mask layer. The benefit of the global reduction in the thickness of the hard mask layer is that it reduces the CMP time for the interconnect level.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit hard mask processing system of the present invention furnishes important and heretofore unknown and unavailable solutions, capabilities, and functional aspects for integrating hard mask layer into the dual damascene low-K dielectric manufacturing process. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices low-K dielectric interconnect structures fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit processing system comprising:
   a substrate having an integrated circuit;
   an interconnect layer over the integrated circuit;
   a low-K dielectric layer applied over the interconnect layer;
   a hard mask layer, applied over the low-K dielectric layer, having no overhang;
   a via opening formed by the hard mask layer having a first opening, aligned with the low-K dielectric layer having a second opening, and aligned with the interconnect layer having a third opening; and an interconnect metal deposited in the via opening, provides that the interconnect metal does not diffuse into the low-K dielectric layer.

2. The system as claimed in claim 1 further comprising a diffusion barrier layer between the low-K dielectric layer and the interconnect metal.

3. The system as claimed in claim 1 wherein the interconnect metal is polished to be coplanar with the low-K dielectric layer.

4. The system as claimed in claim 1 further comprising a cap layer between the low-K dielectric layer and the interconnect layer.

5. The system as claimed in claim 1 wherein no overhang of the hard mask layer is beyond the low-K dielectric layer.

6. The system as claimed in claim 1 further comprising:
an interconnect within the interconnect layer;
a cap layer having an opening; and
a connection between the interconnect metal and the interconnect within the interconnect layer.

7. The system as claimed in claim 6 further comprising a diffusion barrier layer between the low-K dielectric layer and the interconnect metal wherein the diffusion barrier layer forms a barrier to the interconnect metal.

8. The system as claimed in claim 6 wherein the interconnect metal is coplanar with the low-K dielectric layer.

9. The system as claimed in claim 6 further comprising a cap layer between the low-K dielectric layer and the interconnect layer wherein the cap layer includes silicon nitride.

10. The system as claimed in claim 6 wherein no overhang of the hard mask layer is beyond the low-K dielectric layer includes a diffusion barrier layer coplanar with the interconnect metal and the hard mask layer.

* * * * *